US 6,616,969 B2

(12) United States Patent
Pfaendtner et al.

(10) Patent No.: US 6,616,969 B2
(45) Date of Patent: Sep. 9, 2003

(54) APPARATUS AND METHOD FOR SELECTIVELY COATING INTERNAL AND EXTERNAL SURFACES OF AN AIRFOIL

(75) Inventors: Jeffrey A. Pfaendtner, Blue Ash, OH (US); Joseph D. Rigney, Milford, OH (US); Nripendra N. Das, West Chester, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/929,595

(22) Filed: Aug. 14, 2001

(65) Prior Publication Data

US 2001/0055650 A1 Dec. 27, 2001

Related U.S. Application Data

(62) Division of application No. 09/373,433, filed on Aug. 11, 1999, now Pat. No. 6,332,926.

(51) Int. Cl.$^7$ ................................ C23C 16/08
(52) U.S. Cl. ..................... 427/237; 427/252; 427/253; 427/282
(58) Field of Search ................ 427/237, 252, 427/253, 282

(56) References Cited

U.S. PATENT DOCUMENTS

| | | | | |
|---|---|---|---|---|
| 3,801,357 A | * | 4/1974 | Baldi | 427/250 |
| 4,041,196 A | | 8/1977 | Baldi et al. | 427/252 |
| 4,148,275 A | | 4/1979 | Benden et al. | 118/49.5 |
| 4,530,861 A | | 7/1985 | Sippel et al. | 427/444 |
| 4,694,036 A | | 9/1987 | Baldi | 524/473 |
| 4,911,796 A | * | 3/1990 | Reed | 205/125 |
| 4,978,558 A | | 12/1990 | Lamm | 426/250 |
| 5,068,127 A | * | 11/1991 | Fournes et al. | 427/237 |
| 5,221,354 A | | 6/1993 | Rigney | 118/725 |
| 5,565,035 A | | 10/1996 | Sylvestro et al. | 118/721 |
| 5,630,879 A | | 5/1997 | Eichmann et al. | 118/720 |
| 5,688,607 A | * | 11/1997 | Rose et al. | 428/639 |
| 5,695,659 A | | 12/1997 | Dickie | 216/48 |
| 5,792,267 A | | 8/1998 | Marszal et al. | 118/500 |
| 5,803,971 A | | 9/1998 | Menchetti et al. | 118/500 |
| 5,807,428 A | | 9/1998 | Bose et al. | 106/14.44 |
| 5,849,359 A | | 12/1998 | Burns et al. | 427/242 |
| 5,928,725 A | | 7/1999 | Howard et al. | 427/237 |
| 5,985,122 A | | 11/1999 | Conner | 204/84 |
| 6,007,628 A | | 12/1999 | Ittleson et al. | 118/500 |
| 6,037,004 A | | 3/2000 | Zajchowski et al. | 427/282 |
| 6,039,810 A | | 3/2000 | Mantkowski et al. | 118/715 |
| 6,106,231 A | | 8/2000 | Brainch et al. | 416/97 R |
| 6,107,598 A | | 8/2000 | Updegrove et al. | 219/121.7 |
| 6,109,873 A | | 8/2000 | Brooks et al. | 416/62 |

FOREIGN PATENT DOCUMENTS

| | | |
|---|---|---|
| EP | 0457538 A1 | 11/1991 |
| EP | 1079073 A2 | 2/2001 |

* cited by examiner

Primary Examiner—Timothy Meeks
(74) Attorney, Agent, or Firm—Gregory O. Garmong; Carmen Santa Maria; McNees Wallace & Nurick LLC

(57) ABSTRACT

A gas turbine airfoil has an external surface and an internal passage therethrough. The internal passage is selectively coated by providing a source of a flowable precursor coating material in contact with the internal passage of the airfoil, and providing a coating prevention structure overlying at least a portion of the external surface. The flowable precursor coating material is flowed from the source of the flowable precursor coating material and through the internal passage of the airfoil. The coating prevention structure prevents contact of the flowable precursor coating material with the external surface of the airfoil.

24 Claims, 5 Drawing Sheets

APPARATUS AND METHOD FOR SELECTIVELY COATING INTERNAL AND EXTERNAL SURFACES OF AN AIRFOIL

This is a division of patent application Ser. No. 09/373,433, filed Aug. 11, 1999, now U.S. Pat. No. 6,332,926.

FIELD OF THE INVENTION

This invention relates to a gas turbine airfoil having an internal cooling passage, and, more particularly, to the selective protection of the surface of the internal passage of such a gas turbine airfoil.

BACKGROUND OF THE INVENTION

In an aircraft gas turbine (jet) engine, air is drawn into the front of the engine, compressed by a shaft-mounted compressor, and mixed with fuel. The mixture is burned, and the hot exhaust gases are passed through a turbine mounted on the same shaft. The flow of combustion gas turns the turbine by impingement against an airfoil section of the turbine blades and vanes, which turns the shaft and provides power to the compressor and fan. The hot exhaust gases flow from the back of the engine, driving it and the aircraft forwardly.

The hotter the combustion and exhaust gases, the more efficient is the operation of the jet engine. There is thus an incentive to raise the combustion and exhaust gas temperatures. The maximum temperature of the combustion gases is normally limited by the materials used to fabricate the turbine vanes and turbine blades of the turbine, upon which the hot combustion gases impinge. In current engines, the turbine vanes and blades are made of nickel-based superalloys, and can operate at temperatures of up to about 1900–2100° F.

Many approaches have been used to increase the operating temperature limit of the turbine blades and vanes to their current levels. For example, the composition and processing of the base materials themselves have been improved.

Physical cooling techniques may also be used. In one technique, internal cooling passages through the interior of the turbine airfoil are present. Air is forced through the cooling passages and out openings at the external surface of the airfoil, removing heat from the interior of the airfoil and, in some cases, providing a boundary layer of cooler air at the surface of the airfoil. To attain maximum cooling efficiency, the cooling passages are placed as closely to the external surface of the airfoil as is consistent with maintaining the required mechanical properties of the airfoil, to as little as about 0.020 inch in some cases.

In another approach, a protective layer or a ceramic/metal thermal barrier coating (TBC) system is applied to the airfoil, which acts as a substrate. The protective layer with no overlying ceramic layer (in which case the protective layer is termed an "environmental coating") is useful in intermediate-temperature applications. The currently known protective layers include diffusion aluminides and MCrAlX overlays. A ceramic thermal barrier coating layer may be applied overlying the protective layer on the external airfoil surface, to form a thermal barrier coating system (in which case the protective layer is termed a "bond coat"). The thermal barrier coating system is useful in higher-temperature applications. The ceramic thermal barrier coating insulates the component from the combustion gas, permitting the combustion gas to be hotter than would otherwise be possible with the particular material and fabrication process of the substrate.

The surfaces of the internal cooling passages may be protected with a diffusion aluminide coating, which oxidizes to an aluminum oxide protective scale that inhibits further oxidation of the internal surfaces. Although techniques are known for depositing an aluminide protective coating on an internal passage, the present inventors have observed that the available techniques suffer from the shortcoming that they may adversely affect the protection and the repair of the external surface of the airfoil. There is a need for an improved approach to the protection of the internal cooling passages of gas turbine airfoils, which approach does not adversely affect other portions of the airfoils. The present invention fulfills this need, and further provides related advantages.

BRIEF SUMMARY OF THE INVENTION

The present invention provides an apparatus and method for selectively coating the internal cooling passages of an airfoil section, while not coating the external surface with any substantial amount of the material used to coat the internal cooling passages. In the preferred practice, the surfaces of the internal cooling passages are coated with a diffusion aluminide (a term which includes composition-modified aluminides as used herein), which is later oxidized to form a protective aluminum oxide scale. Substantially none of the aluminum-containing composition used to coat the internal passages contacts the external surface to deposit thereon. The inventors have found that deposition of the aluminum on the external surface, followed by deposition of a MCrAlX-type protective layer, may lead to reduced performance of the airfoil. The present approach also provides apparatus which permits the coating of only the internal surfaces with the aluminum and thence the aluminide.

An apparatus for coating a portion of a gas turbine airfoil having an external surface and an internal passage therethrough comprises a source of a flowable precursor coating material in contact with the internal passage of the airfoil, and a coating prevention structure overlying at least a portion of the external surface. The coating prevention structure prevents the contact of the flowable precursor coating material with the external surface of the airfoil.

In operation, a method for coating a portion of a gas turbine airfoil having an external surface and an internal passage therethrough comprises providing a source of a flowable precursor coating material in contact with the internal passage of the airfoil, providing a coating prevention structure overlying at least a portion of the external surface, and flowing the flowable precursor coating material from the source of the flowable precursor coating material and through the internal passage of the airfoil. The coating prevention structure substantially prevents contact of the flowable precursor coating material with the external surface of the airfoil.

The precursor coating material is preferably an aluminum-containing compound, optionally modified with the addition of a modifying element such as hafnium, zirconium, yttrium, silicon, titanium, tantalum, cobalt, chromium, platinum, and palladium, or combinations thereof. The source of the precursor coating material is preferably an aluminum halide gas, optionally mixed with source gases of the modifying elements.

The coating prevention structure substantially prevents contact of the precursor coating material with the external surface of the airfoil, both before the precursor coating material enters the internal passage and after it leaves the internal passage. The result is that very little, if any, of the precursor coating material contacts the external surface, so that little, if any, of the coating material that coats the internal passages is deposited on the external surface. In some cases, it may be desirable to coat the internal passages and a selected portion of the external surface with the aluminide coating, and not coat the remainder of the external surface 38 with the aluminide coating. The present invention provides an approach for achieving that type of coating.

Various types of external coating prevention structures may be used, singly or in combination. In one embodiment, the internal passage includes a precursor inlet end and a precursor outlet end, and the coating prevention structure comprises a housing that isolates the external surface from the precursor inlet end and the precursor outlet end. Where the airfoil has a platform, the housing may be used to isolate the lower side of the platform from the external surface. In other embodiments, the coating prevention structure may comprise a plurality of reactive particles that react with the precursor coating material, a solid mask, a slurry mask, a putty mask, and/or a flowing maskant gas. These various masking techniques may be used in combination, for example, a housing filled with the reactive particles adjacent to the coating surface.

The present approach produces a protective coating on the surfaces of the internal passages of the coating material, which may then be further processed as by interdiffusion. Substantially none of the coating material is deposited on the external surface of the airfoil section. Different protective layers may be deposited on the external surface, without interference from the protective coating on the internal surfaces.

Other features and advantages of the present invention will be apparent from the following more detailed description of the preferred embodiment, taken in conjunction with the accompanying drawings, which illustrate, by way of example, the principles of the invention. The scope of the invention is not, however, limited to this preferred embodiment.

DETAILED DESCRIPTION OF THE INVENTION

Figure 1:
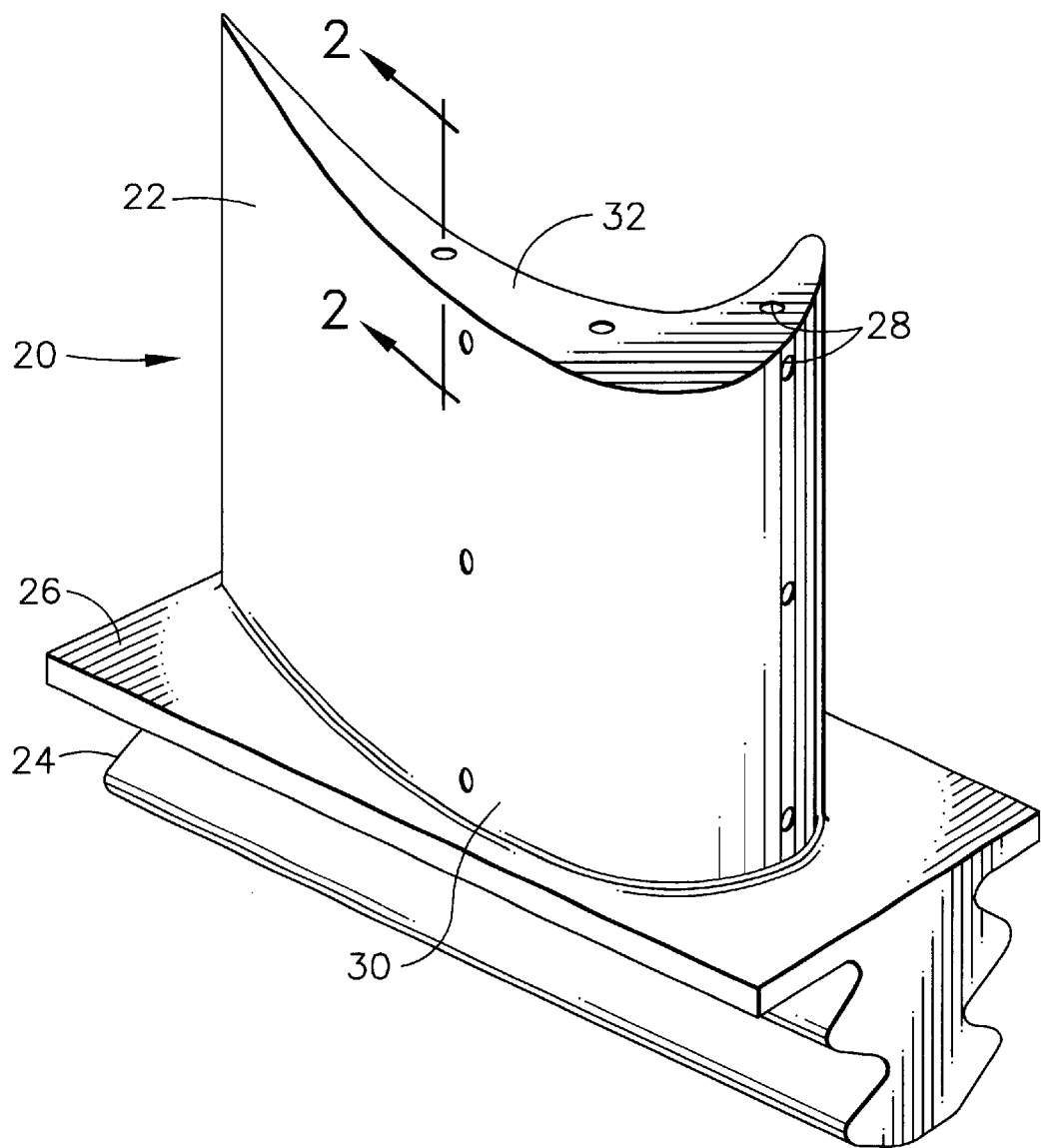
FIG. 1 is a perspective view of a turbine blade.

FIG. 1 depicts a component article of a gas turbine engine such as a turbine blade or turbine vane, and in this illustration a turbine blade 20. The turbine blade 20 is formed of any operable material, but is preferably a nickel-base superalloy. The turbine blade 20 includes an airfoil 22 against which the flow of hot exhaust gas is directed. (The turbine vane has a similar appearance in respect to the pertinent airfoil portions, but typically includes other end structure to support the airfoil.) The turbine blade 20 is mounted to a turbine disk (not shown) by a dovetail 24 which extends downwardly from the airfoil 22 and engages a slot on the turbine disk. A platform 26 extends longitudinally outwardly from the area where the airfoil 22 is joined to the dovetail 24. A number of internal passages extend through the interior of the airfoil 22, ending in openings 28 in the surface of the airfoil 22. A flow of cooling air is directed through the internal passages, to reduce the temperature of the airfoil 22. The airfoil 22 may be described as having a root end 30 adjacent to the dovetail 24, and an oppositely disposed tip end 32 remote from the dovetail 24.

Figure 2:
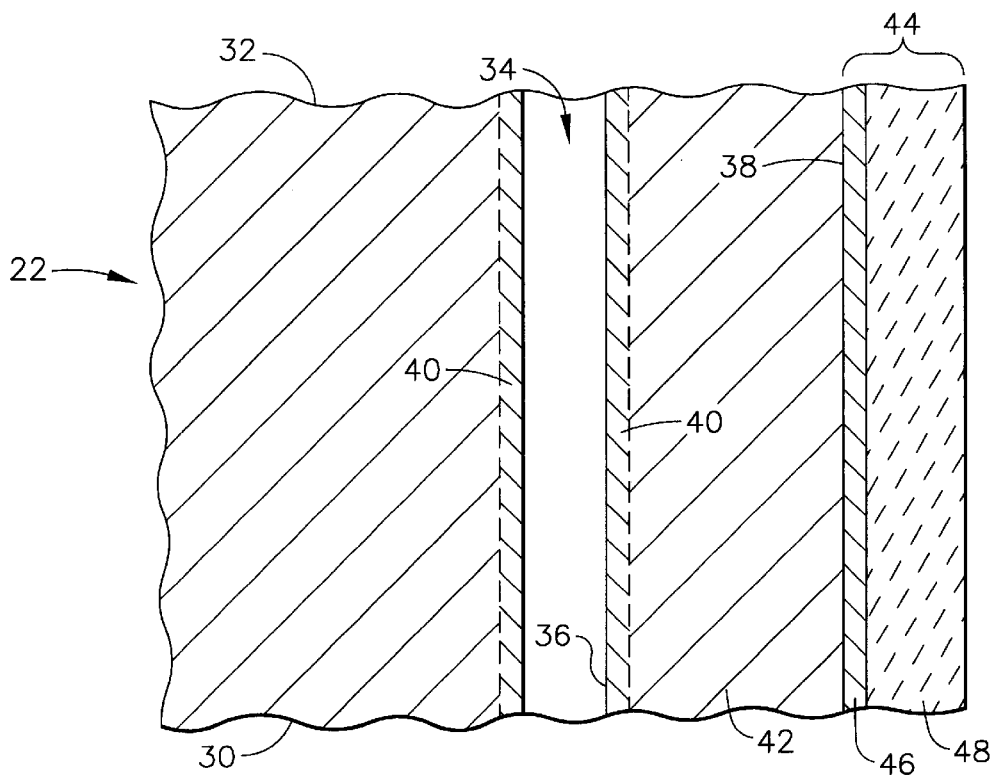
FIG. 2 is an enlarged schematic sectional view through the turbine blade of FIG. 1, taken on lines 2—2.

FIG. 2 is a longitudinal section through the airfoil 22, showing one of the internal passages 34 extending through an interior of the airfoil 22. The internal passage 34 has an internal airfoil surface 36, and there is also an external airfoil surface 38 of the metallic portion of the airfoil 22.

A diffusion aluminide protective region 40 is present at the internal airfoil surface 36. The diffusion aluminide is formed by depositing aluminum onto the internal airfoil surface 36, so that a body of the airfoil 22 serves as a substrate 42. The aluminum is interdiffused with the material of the substrate 42 to form the aluminum-enriched protective region 40 lying below the internal airfoil surface 36. The diffusion aluminide protective region 40 has a composition with the aluminum concentration highest near the internal airfoil surface 36, and decreasing aluminum concentration with increasing distance into the substrate 42 from the internal airfoil surface 36. The diffusion aluminide protective region 40 is typically from about 0.0005 to about 0.003 inch thick. When exposed to a high-temperature oxidizing environment, the aluminum-enriched region at the internal airfoil surface 36 oxidizes to form a highly adherent aluminum oxide ($Al_2O_3$) protective scale at the internal airfoil surface 36, inhibiting and slowing further oxidation damage. Reactive and noble aluminide-modifying elements such as hafnium, zirconium, yttrium, silicon, titanium, tantalum, cobalt, chromium, platinum, and palladium, and combinations thereof, may optionally be present in the diffusion aluminide protective region 40. An overlay coating such as discussed next and applied to the external airfoil surface 38 is not used on the internal airfoil surface 36.

The external airfoil surface 38 may also be protected, and FIG. 2 illustrates one approach. An overlay protective coating 44 overlies and contacts the external airfoil surface 38. The overlay protective coating 44 has a protective layer 46 overlying and contacting the external airfoil surface 38. The protective layer 46 is preferably formed of an MCrAlX composition. The terminology "MCrAlX" is a shorthand term of art for a variety of families of overlay protective layers 46 that may be employed as environmental coatings or bond coats in thermal barrier coating systems. In this and other forms, M refers to nickel, cobalt, iron, and combinations thereof. In some of these protective coatings, the chromium may be omitted. The X denotes elements such as hafnium, zirconium, yttrium, tantalum, rhenium, platinum, silicon, titanium, boron, carbon, and combinations thereof. Specific compositions are known in the art. Some examples of MCrAlX compositions include, for example, NiAlCrZr and NiAlZr, but this listing of examples is not to be taken as limiting. The protective layer 46 is from about 0.0005 to about 0.005 inch thick. Such protective layers 46 are generally known in the art, although specific compositions may not be known.

The previously discussed diffusion aluminide protective region is not present on the external airfoil surface 38 in the present approach. It has sometimes been the practice in the past to deposit an aluminide layer on the external airfoil surface 38, prior to depositing the protective layer 46. That is not permissible with the present invention, and in fact care is taken so that substantially no aluminum is deposited on the external airfoil surface 38 prior to depositing the protective layer 46.

Optionally, a ceramic layer 48 overlies and contacts the protective layer 46. The ceramic layer 48 is preferably yttria-stabilized zirconia, which is zirconium oxide containing from about 2 to about 12 weight percent, preferably from about 3 to about 8 weight percent, of yttrium oxide. The ceramic layer 48 is typically from about 0.003 inch to about 0.010 inch thick. Other operable ceramic materials may be used as well. When there is no ceramic layer 48 present, the protective layer 46 is termed an "environmental coating". When there is a ceramic layer 48 present, the protective layer 46 is termed a "bond coat".

Figure 3:
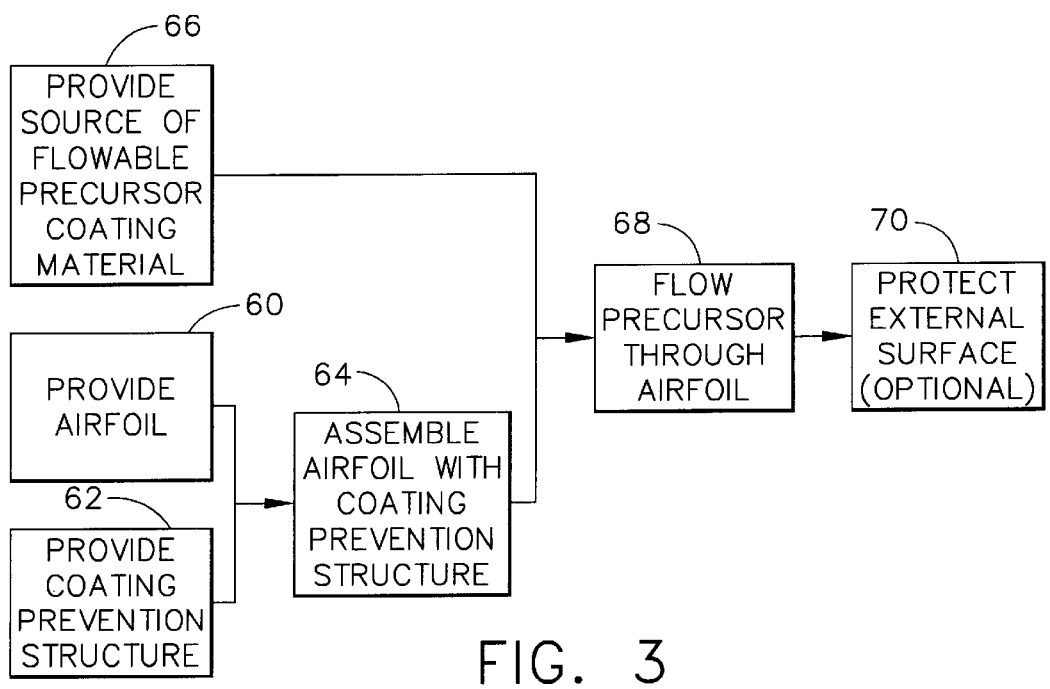
FIG. 3 is a block flow diagram of an approach for preparing a coated gas turbine airfoil.

FIG. 3 is a block diagram of an approach for practicing the present invention. An airfoil is provided, numeral 60. The airfoil is preferably the airfoil 22 of FIG. 1, either as a turbine blade or turbine vane. The airfoil (and all of the turbine blade or turbine vane) may be made of any operable base-metal alloy material, with a nickel-base superalloy being preferred. As used herein, "nickel-base" means that the composition has more nickel present than any other element. The nickel-base superalloys are typically of a composition that is strengthened by the precipitation of gamma-prime phase. The preferred nickel-base alloy has a composition, in weight percent, of from about 4 to about 20 percent cobalt, from about 1 to about 10 percent chromium, from about 5 to about 7 percent aluminum, from 0 to about 2 percent molybdenum, from about 3 to about 8 percent tungsten, from about 4 to about 12 percent tantalum, from 0 to about 2 percent titanium, from 0 to about 8 percent rhenium, from 0 to about 6 percent ruthenium, from 0 to about 1 percent niobium, from 0 to about 0.1 percent carbon, from 0 to about 0.01 percent boron, from 0 to about 0.1 percent yttrium, from 0 to about 1.5 percent hafnium, balance nickel and incidental impurities.

A most preferred alloy composition is Rene' N5, which has a nominal composition in weight percent of about 7.5 percent cobalt, about 7 percent chromium, about 6.2 percent aluminum, about 6.5 percent tantalum, about 5 percent tungsten, about 1.5 percent molybdenum, about 3 percent rhenium, about 0.05 percent carbon, about 0.004 percent boron, about 0.15 percent hafnium, up to about 0.01 percent yttrium, balance nickel and incidental impurities. Other operable superalloys include, for example, Rene' N6, which has a nominal composition in weight percent of about 12.5 percent cobalt, about 4.2 percent chromium, about 1.4 percent molybdenum, about 5.75 percent tungsten, about 5.4 percent rhenium, about 7.2 percent tantalum, about 5.75 percent aluminum, about 0.15 percent hafnium, about 0.05 percent carbon, about 0.004 percent boron, about 0.01 percent yttrium, balance nickel and incidental impurities; Rene' 142, which has a nominal composition in weight percent of about 6.8 percent chromium, about 12.0 percent cobalt, about 1.5 percent molybdenum, about 2.8 percent rhenium, about 1.5 percent hafnium, about 6.15 percent aluminum, about 4.9 percent tungsten, about 6.35 percent tantalum, about 150 parts per million boron, about 0.12 percent carbon, balance nickel and incidental impurities; CMSX-4, which has a nominal composition in weight percent of about 9.60 percent cobalt, about 6.6 percent chromium, about 0.60 percent molybdenum, about 6.4 percent tungsten, about 3.0 percent rhenium, about 6.5 percent tantalum, about 5.6 percent aluminum, about 1.0 percent titanium, about 0.10 percent hafnium, balance nickel and incidental impurities; CMSX-10, which has a nominal composition in weight percent of about 7.00 percent cobalt, about 2.65 percent chromium, about 0.60 percent molybdenum, about 6.40 percent tungsten, about 5.50 percent rhenium, about 7.5 percent tantalum, about 5.80 percent aluminum, about 0.80 percent titanium, about 0.06 percent hafnium, about 0.4 percent niobium, balance nickel and incidental impurities; PWA1480, which has a nominal composition in weight percent of about 5.00 percent cobalt, about 10.0 percent chromium, about 4.00 percent tungsten, about 12.0 percent tantalum, about 5.00 percent aluminum, about 1.5 percent titanium, balance nickel and incidental impurities; PWA1484, which has a nominal composition in weight percent of about 10.00 percent cobalt, about 5.00 percent chromium, about 2.00 percent molybdenum, about 6.00 percent tungsten, about 3.00 percent rhenium, about 8.70 percent tantalum, about 5.60 percent aluminum, about 0.10 percent hafnium, balance nickel and incidental impurities; and MX-4, which has a nominal composition as set forth in U.S. Pat. No. 5,482,789, in weight percent, of from about 0.4 to about 6.5 percent ruthenium, from about 4.5 to about 5.75 percent rhenium, from about 5.8 to about 10.7 percent tantalum, from about 4.25 to about 17.0 percent cobalt, from 0 to about 0.05 percent hafnium, from 0 to about 0.06 percent carbon, from 0 to about 0.01 percent boron, from 0 to about 0.02 percent yttrium, from about 0.9 to about 2.0 percent molybdenum, from about 1.25 to about 6.0 percent chromium, from 0 to about 1.0 percent niobium, from about 5.0 to about 6.6 percent aluminum, from 0 to about 1.0 percent titanium, from about 3.0 to about 7.5 percent tungsten, and wherein the sum of molybdenum plus chromium plus niobium is from about 2.15 to about 9.0 percent, and wherein the sum of aluminum plus titanium plus tungsten is from about 8.0 to about 15.1 percent, balance nickel and incidental impurities. The use of the present invention is not limited to these preferred alloys, and has broader applicability.

Figure 4:
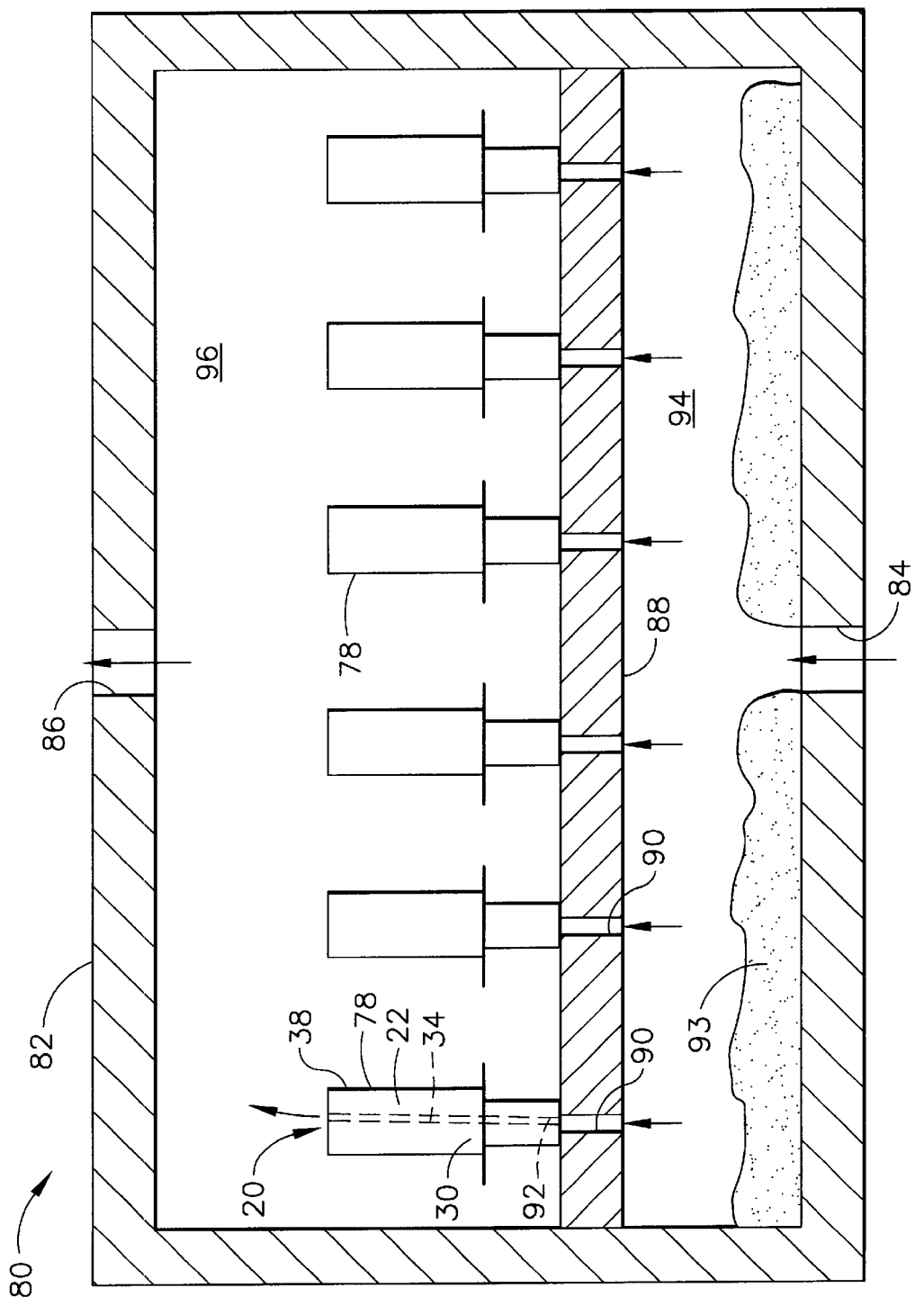
FIG. 4 is a schematic sectional view of a deposition apparatus for coating the internal passageways of gas turbine airfoils.

A coating prevention structure 78 is provided, numeral 62. The coating prevention structure, which may also be termed an external coating prevention structure, permits coating on the internal passages 34 but not on the external airfoil surface 38. Some specific types of coating prevention structures 78 will be discussed in relation to FIGS. 5–13. The airfoil 22 is assembled together, numeral 64, with the coating prevention structure within a deposition apparatus 80, illustrated in FIG. 4. The preferred deposition apparatus 80 of FIG. 4 includes a retort 82 having a retort inlet 84 and a retort outlet 86. A number of turbine blades 20 or turbine vanes are placed on a support 88 which is a solid barrier in the retort 82, except for a number of flow channels 90 therethrough. Each of the flow channels 90 is continuous with a precursor inlet end 92 of the internal passages 34 of the turbine blade 20. The precursor inlet end 92 is preferably at the root end 30 of the turbine blade 20. The support 88 divides the interior of the retort 82 into a source chamber 94 on one side of the support 88 and an outlet plenum 96 on the other side of the support 88. Gas can flow from the source chamber 94 to the outlet plenum 96 only by flowing through the flow channels 90 and the internal passages 34.

In operation, aluminum and optional modifying elements are first deposited onto the internal airfoil surface 36 by any operable technique. A source of a flowable precursor coating material is provided, numeral 66. In one approach, the source of aluminum is preferably a gaseous source. A mixture 93 of aluminum metal, aluminum alloy, or aluminum-containing compound, together with a halide activator, preferably aluminum fluoride, is placed into the source chamber 94. Upon heating, the activator vaporizes to form a halide gas. The halide gas contacts the aluminum metal, aluminum alloy, or aluminum-containing compound to form the corresponding aluminum halide gas. Aluminide-modifying elements such as hafnium, zirconium, yttrium, silicon, titanium, tantalum, cobalt, chromium, platinum, palladium, and combinations thereof, may optionally be doped from similar sources into the gaseous source. Argon or hydrogen gas is flowed into the source chamber 94 portion of the retort 82 through the retort inlet 84, providing a carrier for the aluminum-containing gas.

The resulting source gas flows through the flow channels 90 and thence through the internal passages 34, numeral 68. Aluminum and any optional modifying elements are deposited onto the internal airfoil surface 36 along the length of each internal passage 34. The retort 82 is usually heated to a deposition reaction temperature of from about 1800° F. to about 2100° F. so that deposited aluminum atoms and modifier atoms interdiffuse into the substrate 42. An aluminum coating about 0.002 inch thick may be deposited in about 4–8 hours using this approach. Optionally, the heating may be continued after the flow of aluminum-source gas is discontinued, to achieve further interdiffusion.

Other operable approaches for introducing the source of aluminum into the internal passages 34 may also be used. Examples include chemical vapor deposition, slurry-coating processes, and above-the-pack aluminiding.

In the apparatus 80, the coating prevention structure 78 is indicated only generally. FIGS. 5–13 illustrate some preferred embodiments of the coating prevention structure 78 which may be used in the apparatus 80, for each of the individual turbine blades or vanes. It is understood that each of the coating prevention structures 78 of FIGS. 5–13, as well as other operable techniques, may be used in conjunction with the general form of apparatus 80 of FIG. 4, as well as with other operable forms of coating apparatus. In each case, the function of the coating prevention structure 78 is to prevent deposition of aluminum on the external surface 38, while not interfering with deposition of aluminum on the internal surfaces 36 as discussed above for the apparatus 80 of FIG. 4.

Figure 5:
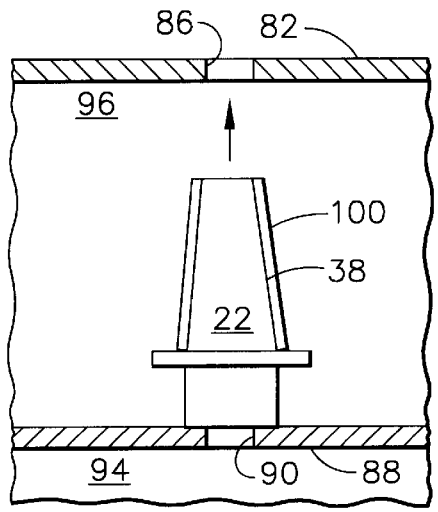
FIGS. 5–13 are detail sectional views of coating prevention structures operable with the present approach.

In FIG. 5, the coating prevention structure 78 comprises a solid mask 100 in contact with the external surface 38. A preferred solid mask 100 is a metal foil such as a nickel foil, possibly containing aluminum in the same percentage content as the base-metal alloy, a molybdenum foil, or a tantalum foil. Such masking material is available commercially from Johnson Mathey, Ward Hill, Mass. Non-metallic materials such as graphite foil may also be operable.

Figure 6:
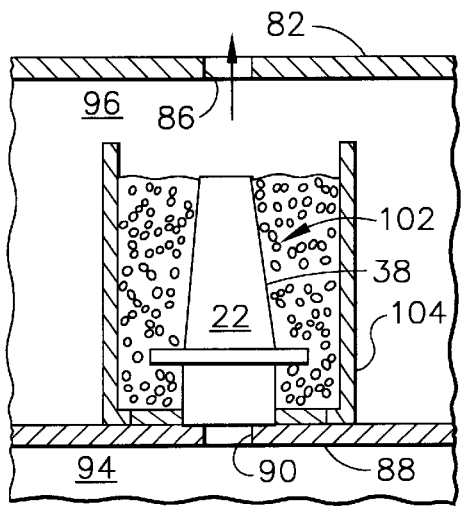

FIG. 6, the coating prevention structure 78 comprises a mass of powder particles 102 within a container 104 that contacts the mass of powder particles 102 to the external surface 38 of the airfoil 22. The particles may be, for example, a nickel-aluminum alloy having substantially the same aluminum percentage content as the base-metal alloy, which chemically reacts with the aluminum-source gas to prevent it from contacting the external surface 38. The metal particles may be mixed with inert particles such as aluminum oxide particles, nickel-powder, or chromium-powder compounds.

Figure 7:
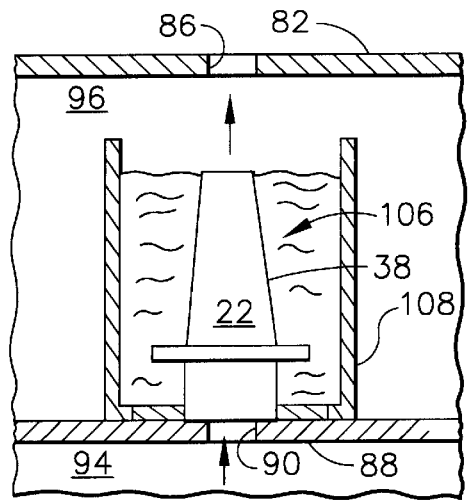

In FIG. 7, the coating prevention structure 78 comprises a high-viscosity slurry maskant 106 within a container 108 that contacts the slurry maskant 106 to the external surface 38 of the airfoil 22. The slurry maskant may be, for example, a composition comprising the same particles 102 discussed above mixed with a binder and dried, which chemically reacts with the aluminum-source gas to prevent it from contacting the external surface 38 or may be used to hold a physical mask in place.

Figure 8:
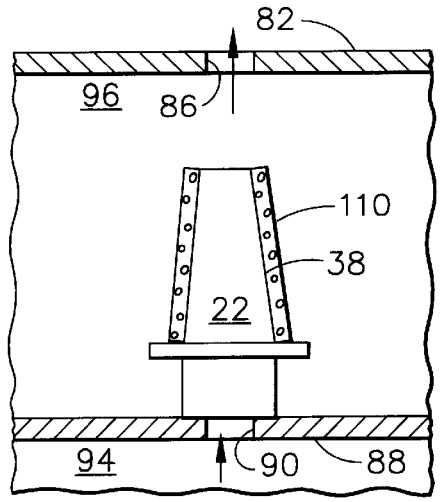

In FIG. 8, the coating prevention structure 78 comprises a tape or putty 110 that is placed into close contact with the exterior surface 38. The tape or putty maskant may be, for example, a composition comprising the same particles 102 discussed above mixed with a binder, which chemically reacts with the aluminum-source gas to prevent it from contacting the external surface 38. For example, T-block masking tape maskant is available commercially from Chromalloy Israel, Ltd. This masking tape comprises a first mask sublayer overlying and contacting the surface 64, and a second mask sublayer overlying and contacting the first mask sublayer. The first mask sublayer is formed of a mixture of inert oxide powders in a binder. The second mask sublayer is formed of a mixture of aluminum oxide powder, other ceramic powders such as aluminum silicate, and metallic powders, such as nickel or nickel-aluminum powder, in a binder. The maskant 62 may be of any operable thickness, typically from about 0.028 inch to about 0.090 inch thick.

Figure 9:
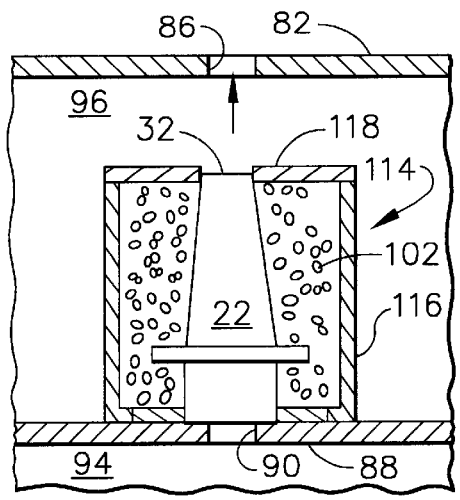

In FIG. 9, the coating prevention structure 78 includes an enclosure 114 with sides 116 and a cover 118 that is just sufficiently large to permit the tip end 32 of the airfoil 22 to extend therethrough. A maskant such as the powder particles 102, or any of the other types of maskants discussed herein, is placed within the enclosure 114 to provide a further obstacle to the diffusion of the aluminum-containing source gas to the external surface 38.

Figure 10:
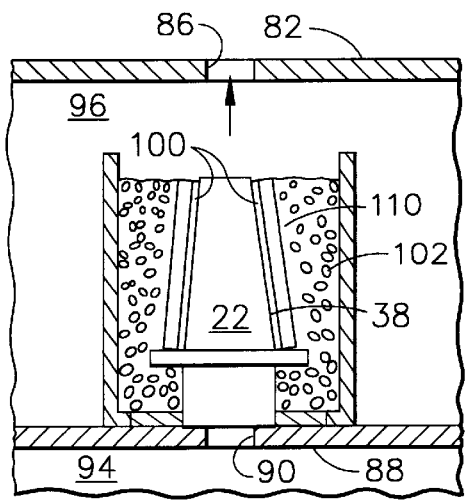

At the deposition reaction temperature of from about 1800° F. to about 2100° F., the aluminum-containing source gas is highly diffusive and mobile. It is therefore desirable where possible to combined two or more of the types of coating prevention structures 78, such as those discussed earlier. In FIG. 10, for example, powder particles 102, a tape or putty 110, and a solid mask 100 are used. A cover may also be placed over the sides to form a closed enclosure as shown in FIG. 9, except for where the tip end 32 extends through the cover.

Figure 11:
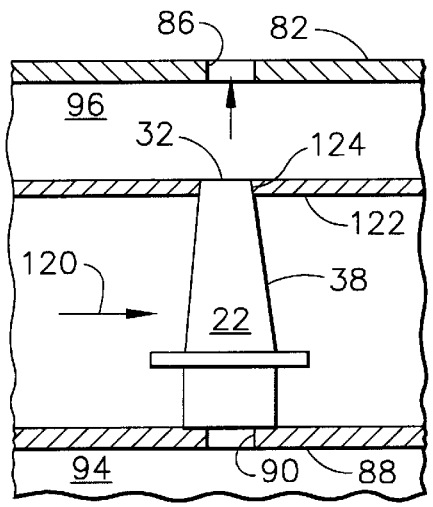

In FIG. 11, the coating prevention structure 78 includes a flow 120 of a nonreactive gas that flows past the external surface 38 of the airfoil 22. The nonreactive gas is typically an inert gas such as argon. The flow 120 of the nonreactive gas is separated from the flow of the aluminum-source gas by a separator 122 with an opening 124 therein for the tip end 32 of the airfoil 22 to protrude through. The flow 120 of the nonreactive gas dilutes and sweeps away any of the aluminum-source gas that leaks through the space between the tip end 32 and the opening 124 and the aluminum-source gas that flows out of the openings of the internal passages, minimizing any deposition of aluminum on the external surface 38.

Figure 12:
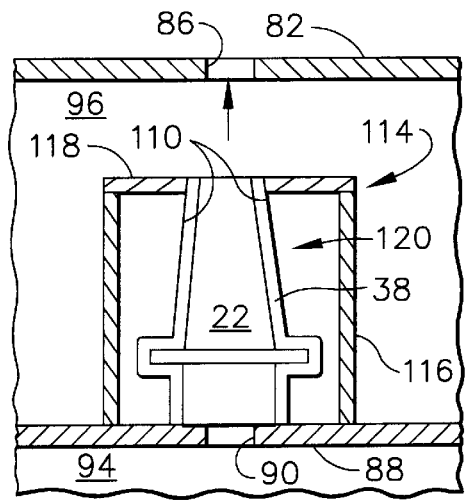

In FIG. 12, the enclosure 114 of FIG. 9, the tape or putty 110 of FIG. 8, and the flow 120 of nonreactive gas (in a direction out of the plane of the page in FIG. 12) are combined in a single coating prevention structure to further minimize the likelihood of deposition of aluminum on the external surface 38.

Figure 13:
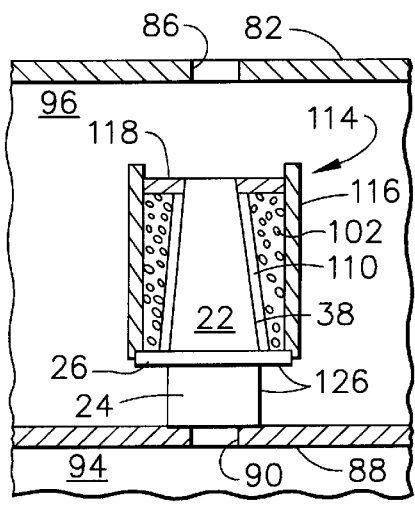

In some cases, it may be desirable to coat the internal passages 34 and a portion of the external surface 38 with the aluminide coating, and not coat the remainder of the external surface 38 with the aluminide coating. FIG. 13 illustrates a coating prevention structure for accomplishing this combination. The external surface 38 of the airfoil 22 is to remain uncoated with the aluminide, but the undersides of the platform 26 and the dovetail 28 are to be coated with the aluminide. In this case, the enclosure 114 is used, but the sides extend only downwardly for a distance sufficient to enclose the top side of the platform 26 and the external surface 38 of the airfoil 22. The powder 102 and tape or putty maskants 110 as described earlier are also used in this embodiment. The surfaces of the underside of the platform 26 and the dovetail 24 are exposed to the environment of the outlet plenum 96, which is filled with aluminum-containing source gas when the apparatus 80 is in operation. Aluminum is therefore deposited on the underside of the platform 26 and on the surface of the dovetail 24, as well as on the internal surfaces 36 of the internal passages 34. In a variation of the approach of FIG. 13, portions of the dovetail 24 may be masked to prevent aluminiding thereon.

Other configurations, combinations, and variations of these coating prevention structures 78 may be used, as long as they are consistent with the approach of the invention.

After the aluminum coating step 68, the external surfaces 38 which were uncoated with aluminum in step 68 may optionally be protected, numeral 70. In the preferred approach whose result is illustrated in FIG. 2, the overlay protective coating 44 is deposited overlying and contacting the external airfoil surface 38. The overlay protective coating 44 includes the protective layer 46 deposited onto the external airfoil surface 38. The protective layer 46 is preferably is of the MCrAlX type. The protective layer 46 is deposited by any operable technique, such as physical vapor deposition (e.g., sputtering, cathodic arc, electron beam) or thermal spray. No aluminum layer is deposited onto the external airfoil surface 38 as part of this step. The protective layer 46 is preferably from about 0.0005 to about 0.005 inch, most preferably about 0.002 inch, thick.

The overlay protective coating optionally includes the ceramic layer 48, deposited overlying and contacting the protective layer 46. The ceramic layer 48 is preferably from about 0.003 to about 0.010 inch thick, most preferably about 0.005 inch thick. (FIG. 2 is not drawn to scale.) The ceramic layer 48 is preferably yttria-stabilized zirconia, which is zirconium oxide containing from about 2 to about 12 weight percent, preferably from about 3 to about 8 weight percent, of yttrium oxide. Other operable ceramic materials may be used as well. It may be deposited by any operable technique, such as physical vapor deposition or thermal spray.

The present invention has been reduced to practice in a proof of concept experiment using a turbine blade made of Rene' N5 alloy. The external surface of the airfoil was masked with a commercially available braze maskant tape termed Braz-Stop made by Vitta Corp., which had been modified by dipping it into a powder of Rene' 142 alloy. The metal powder adhered to the tape's adhesive. The face of the tape with the powder thereon was placed into contact with the external surface of the airfoil. A molybdenum metal foil was placed over the tape and held in place with nickel wire wrapped around the airfoil. The blade was placed into the deposition apparatus 80 of FIG. 4. Aluminiding source gas was flowed through the internal passages of the airfoil section for 5 hours at 1975° F. The internal passages were coated with aluminum. The external surface was uncoated, except for a few defect areas where the maskant pulled away from the external surface. These defects are expected to be eliminated with implementation of improved maskant techniques such as illustrated in FIGS. 5–13.

Although a particular embodiment of the invention has been described in detail for purposes of illustration, various modifications and enhancements may be made without departing from the spirit and scope of the invention. Accordingly, the invention is not to be limited except as by the appended claims.

What is claimed is:

1. A method for coating a portion of a gas turbine airfoil having an external surface and an internal passage therethrough, comprising:
   providing a source of a flowable precursor coating material in contact with the internal passage of the airfoil;
   providing a coating prevention structure overlying at least a portion of the external surface; and
   flowing the flowable precursor coating material from the source of the flowable precursor coating material and through the internal passage of the airfoil, the coating prevention structure substantially preventing contact of the flowable precursor coating material with the external surface of the airfoil.

2. The method of claim 1, wherein the source of a flowable precursor coating material comprises an aluminum-containing gas.

3. The method of claim 1, wherein the source of a flowable precursor coating material comprises an aluminum-containing gas which also contains an aluminide-modifying element selected from the group consisting of hafnium, zirconium, yttrium, silicon, titanium, tantalum, cobalt, chromium, platinum, palladium, and combinations thereof.

4. The method of claim 1, wherein the source of a flowable precursor coating material is an aluminum halide gas.

5. The method of claim 1, wherein the internal passage includes a precursor inlet end and a precursor outlet end, and wherein the coating prevention structure comprises a housing that isolates the external surface from the precursor inlet end and the precursor outlet end.

6. The method of claim 5, wherein the airfoil has a platform with an upper side closer to the precursor outlet end and a lower side closer to the precursor inlet end, and wherein the housing isolates the lower side of the platform from the external surface.

7. The method of claim 1, wherein the coating prevention structure comprises a plurality of reactive particles that react with the precursor coating material.

8. The method of claim 1, wherein the coating prevention structure comprises a solid mask.

9. The method of claim 1, wherein the coating prevention structure comprises a slurry mask.

10. The method of claim 1, wherein the coating prevention structure comprises a putty mask.

11. The method of claim 1, wherein the coating prevention structure comprises a flowing maskant gas.

12. The method of claim 11, wherein the coating prevention structure comprises at least two types of masks.

13. A method for coating a portion of a gas turbine airfoil having an external surface and an internal passage therethrough with an inlet end, comprising the steps of:
   providing a coating deposition apparatus;
   assembling the gas turbine airfoil and a coating prevention structure together within the coating deposition apparatus, wherein the coating prevention structure overlies at least a portion of the external surface of the airfoil and permits coating on the internal passage but not on the portion of the external surface of the airfoil; and
   providing a gaseous precursor coating material within the coating deposition apparatus; and
   flowing the gaseous precursor coating material into the inlet end of the internal passage and through the internal passage, the coating prevention structure substantially preventing contact of the gaseous precursor coating material with the portion of the external surface of the airfoil.

14. The method of claim 13, wherein the gaseous precursor coating material comprises an aluminum-containing gas.

15. The method of claim 13, wherein the source of the flowable precursor coating material comprises an aluminum-containing gas which also contains an aluminide-modifying element selected from the group consisting of hafnium, zirconium, yttrium, silicon, titanium, tantalum, cobalt, chromium, platinum, palladium, and combinations thereof.

16. The method of claim 13, wherein the internal passage includes a precursor outlet end, and wherein the coating prevention structure comprises a housing that isolates the external surface from the precursor inlet end and the precursor outlet end.

17. The method of claim 16, wherein the airfoil has a platform with an upper side closer to the precursor outlet end and a lower side closer to the precursor inlet end, and wherein the housing isolates the lower side of the platform from the external surface.

18. The method of claim 13, wherein the coating prevention structure comprises a plurality of reactive particles that react with the precursor coating material.

19. The method of claim 13, wherein the coating prevention structure comprises a solid mask.

20. The method of claim 13, wherein the coating prevention structure comprises a slurry mask.

21. The method of claim 13, wherein the coating prevention structure comprises a putty mask.

22. The method of claim 13, wherein the coating prevention structure comprises a flowing maskant gas.

23. The method of claim 13, wherein the coating prevention structure comprises at least two types of masks.

24. A method for coating a portion of a gas turbine airfoil having an external surface and an internal passage therethrough with an inlet end, comprising the steps of:

providing a coating deposition apparatus having a source chamber;

assembling the gas turbine airfoil and a coating prevention structure together within the coating deposition apparatus, wherein the coating prevention structure overlies at least a portion of the external surface of the airfoil and permits coating on the internal passage but not on the portion of the external surface of the airfoil; and flowing a gaseous precursor coating material from the source chamber, into the inlet end of the internal passage of the gas turbine airfoil, and through the internal passage, the coating prevention structure substantially preventing contact of the gaseous precursor coating material with the portion of the external surface of the airfoil.

* * * * *